United States Patent
Kijima et al.

[11] Patent Number: 5,773,860
[45] Date of Patent: Jun. 30, 1998

[54] SEMICONDUCTOR DEVICE INCLUDING MOS CAPACITANCE

[75] Inventors: Masaki Kijima; Akinobu Manabe, both of Hyogo, Japan

[73] Assignee: Mitsubishi Denki Kabushiki Kaisha, Tokyo, Japan

[21] Appl. No.: 795,216

[22] Filed: Feb. 5, 1997

[30] Foreign Application Priority Data

Sep. 13, 1996  [JP]  Japan ................................. 8-243523

[51] Int. Cl.$^6$ .................. H01L 27/108; H01L 29/76; H01L 29/94; H01L 31/119
[52] U.S. Cl. ................. 257/306; 257/532; 257/369
[58] Field of Search ..................... 257/246, 303, 257/335, 340, 369, 371, 386, 532, 548, 917, 306

[56] References Cited

U.S. PATENT DOCUMENTS

| | | | |
|---|---|---|---|
| 5,416,354 | 5/1995 | Blackstone | 257/499 |
| 5,548,150 | 8/1996 | Omura et al. | 257/349 |
| 5,576,570 | 11/1996 | Ohsawa et al. | 257/369 |

FOREIGN PATENT DOCUMENTS 6-21445  1/1994  Japan ................................ 257/335

*Primary Examiner*—Wael Fahmy
*Assistant Examiner*—Howard Weiss
*Attorney, Agent, or Firm*—McDermott, Will & Emery

[57] ABSTRACT

An improved semiconductor device including an MOS capacitance is provided, having enhanced MOS capacitance accuracy. A well of a first conductivity type is formed at the main surface of a semiconductor substrate. The above-described well is removed immediately under a capacitance dope layer.

2 Claims, 12 Drawing Sheets

PHOSPHOURS IMPLANTATION
(CAPACITANCE DOPE LAYER)

BORON IMPLANTATION
(P-WELL FORMATION)

GATE ELECTRODE FORMATION
SIDEWALL FORMATION
N+ DIFFUSION LAYER FORMATION

↓ PHOSPHOURS IMPLANTATION
(N-WELL FORMATION)
FIELD FORMATION

↓ BORON IMPLANTATION
(CAPACITANCE DOPE LAYER)

↓ GATE ELECTRODE FORMATION
SIDEWALL FORMATION
$P^+$ DIFFUSION LAYER FORMATION

↓ PHOSPHOURS IMPLANTATION
(CAPACITANCE DOPE LAYER)

↓ BORON IMPLANTATION
(P-WELL FORMATION)

↓ GATE ELECTRODE FORMATION
SIDEWALL FORMATION
N+ DIFFUSION LAYER FORMATION

SEMICONDUCTOR DEVICE INCLUDING MOS CAPACITANCE

BACKGROUND OF THE INVENTION

1. Field of the Invention

The present invention relates generally to a semiconductor device including an MOS capacitance and, more particularly, to a semiconductor device including an MOS capacitance improved so as to enhance accuracy of the MOS capacitance. The present invention also relates to a method of manufacturing such semiconductor devices.

2. Description of the Background Art

An MOS (Metal-Oxide-Semiconductor) capacitance is used for an A-D converter, a D-A converter and so on. FIGS. 10A to 10D show features of a method of manufacturing a conventional semiconductor device including an MOS capacitance shown in FIG. 11.

Referring to FIG. 10A, a P-type semiconductor substrate 1 is prepared, having a field oxide film 2 formed thereat. On semiconductor substrate 1, a resist film 3 is formed to mask a region except where a capacitance dope layer is to be formed.

Referring to FIGS. 10A and 10B, a capacitance dope layer 4 is formed by implanting phosphorus into the surface of semiconductor substrate 1 while using resist film 3 as a mask.

Referring to FIG. 10C, a P-well 5 is formed in the surface of semiconductor substrate 1 by selectively implanting boron into a region where a well needs to be formed, while using a resist film (not shown).

Referring to FIG. 10D, a doped polysilicon layer 6 is formed on semiconductor substrate 1, with an insulating film interposed, and a WSi layer 7 is formed thereon. Then, these layers are patterned to a shape of a gate electrode 8. Gate electrode 8 serves as one of upper/lower electrodes. A sidewall spacer 9 is formed on the sidewall of gate electrode 8. Next, an $N^+$ diffusion layer 10 is formed by implanting N-type impurity ions into the surface of semiconductor substrate 1, while using gate electrode 8 and sidewall spacer 9 as a mask.

Thereafter, referring to FIG. 11, an interconnection 11 connecting to gate electrode 8 is formed on semiconductor substrate 1, and it connects $N^+$ diffusion layer 10 to the other one of upper/lower electrodes 12.

FIG. 12 shows an arrangement of wells at the surface of a semiconductor substrate. The MOS capacitance shown in FIG. 11 is formed within P-well 5 shown in FIG. 12.

As described above, impurity diffusion layers (4, 10) of the conventional MOS capacitance are formed within a well. For instance, if impurity diffusion layers of an MOS capacitance are $n^+$-type, they are formed within a P-well. That is, P-well 5 is formed immediately under capacitance dope layer 4 as shown in FIG. 10D. In the MOS capacitance, applying voltage to an impurity diffusion layer and connecting a semiconductor substrate to ground produces electrostatic capacitance between an $N^+$ layer and a P-well. This electrostatic capacitance is defined as parasitic capacitance. A problem is that larger value of the electrostatic capacitance decreases accuracy and limits usage of an MOS capacitance. Parasitic capacitance is represented by the following equations.

$$C = \frac{Ks \cdot \epsilon_0}{W}$$

$\epsilon_0$: vacuum permittivity
Ks: specific permittivity
W: width of depletion region $$W = \sqrt{\frac{2Ks\epsilon_0}{\epsilon} \cdot \frac{N_A + N_D}{N_A N_D} \phi_T}$$

$N_A$: acceptor concentration
$N_D$: donor concentration
if $N_D \gg N_A$ $$W = \sqrt{\frac{2Ks\epsilon_0}{qN_A} \phi_T}$$

As is apparent from the above equations, the higher the concentration of a P-well, the greater the parasitic capacitance.

SUMMARY OF THE INVENTION

The present invention aims to solve the above-described problems and its object is to provide a semiconductor device including an MOS capacitance improved so as to enhance accuracy of the MOS capacitance.

Another object of the present invention is to provide a method of manufacturing such a semiconductor device including an MOS capacitance.

A semiconductor device including an MOS capacitance, in accordance with a first aspect of the present invention, includes a semiconductor substrate of a first conductivity type having a main surface. A well of the first conductivity type is formed at the main surface of the semiconductor substrate. A capacitance dope layer of a second conductivity type is provided at the surface of the well of the first conductivity type. On the semiconductor substrate, one of upper/lower electrodes is provided to be in contact with the capacitance dope layer with an insulating film posed therebetween. At the main surface of the well, a high concentration impurity diffusion layer of the second conductivity type having higher concentration than the capacitance dope layer is provided to be electrically connected to the capacitance dope layer. The other one of upper/lower electrodes is provided on the semiconductor substrate to be in contact with the high concentration impurity diffusion layer. The well is removed immediately under the capacitance dope layer.

According to a preferred embodiment of the present invention, the well is also removed immediately under the high concentration impurity diffusion layer.

A method of manufacturing a semiconductor device including an MOS capacitance, in accordance with a second aspect of the present invention, relates to a method of manufacturing a semiconductor device including an MOS capacitance formed inside a well of first conductivity type. A semiconductor substrate of the first conductivity type is prepared. A capacitance dope layer of the second conductivity type is formed at the main surface of the semiconductor substrate. A well of the first conductivity type is formed at the surface of the semiconductor substrate by implanting impurity ions of the first conductivity type while masking the region on the capacitance dope layer where one of upper/lower electrodes for the MOS capacitance is being formed. On the capacitance dope layer, the one electrode for the MOS capacitance is formed, with an insulating film therebetween. At the surface of the well, a high concentration impurity diffusion layer of the second conductivity type is formed, electrically connected to the capacitance dope layer and having higher concentration than the capacitance dope layer. The other one of upper/lower electrodes for the MOS capacitance is formed, electrically connected to the high concentration impurity layer.

According to a method of manufacturing a semiconductor device including an MOS capacitance, in accordance with a third aspect of the present invention, a semiconductor substrate of a first conductivity type is prepared. A capacitance dope layer of a second conductivity type is formed at the main surface of the semiconductor substrate. On the capacitance dope layer, one of upper/lower electrodes for the MOS capacitance is formed, with an insulating layer therebetween. At the main surface of the semiconductor substrate, a high concentration impurity diffusion layer of the second conductivity type having higher concentration than the capacitance dope layer is formed to be electrically connected to the capacitance dope layer. A well of the first conductivity type is formed by implanting impurity ions of the first conductivity type into the main surface of the semiconductor substrate while masking the capacitance dope layer and the high concentration impurity diffusion layer. On the semiconductor substrate, the other one of upper/lower electrodes for the MOS capacitance is formed which electronically connects to the high concentration impurity diffusion layer.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described below with reference to the drawings.

First Embodiment

Figure 1:
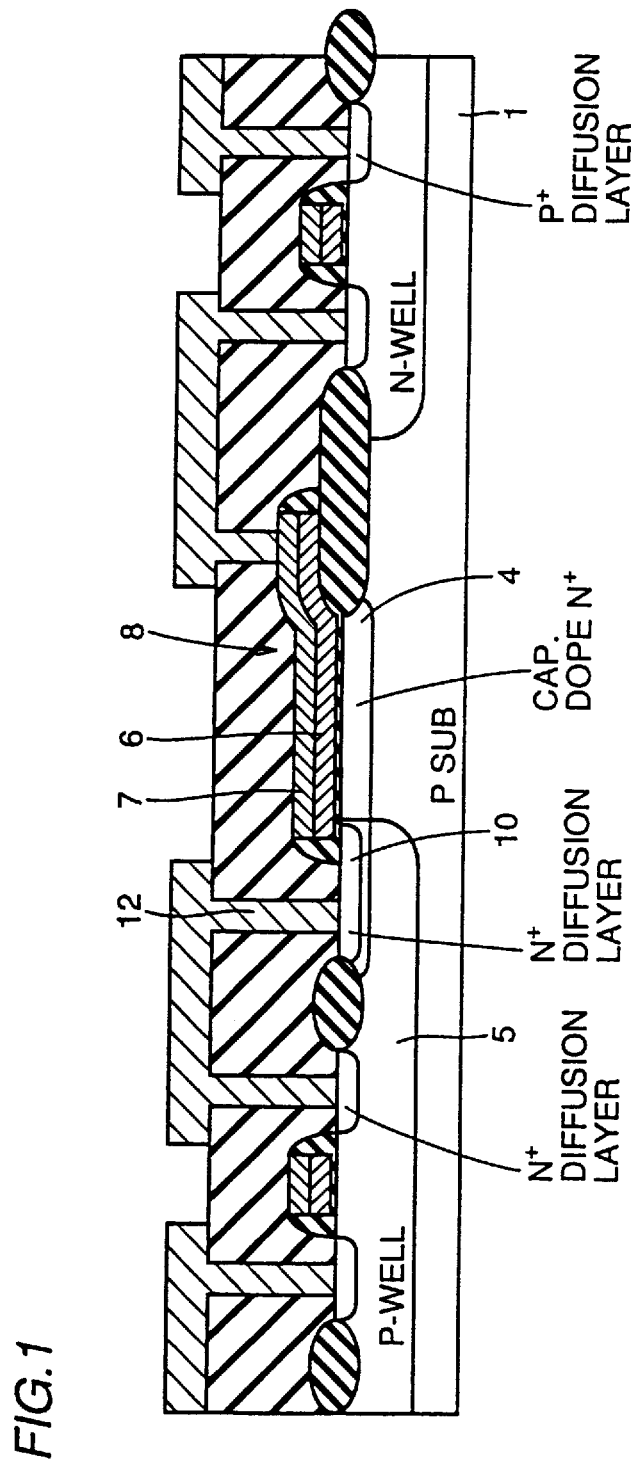
FIG. 1 is a cross section of a semiconductor device in accordance with a first embodiment.
Figure 2:
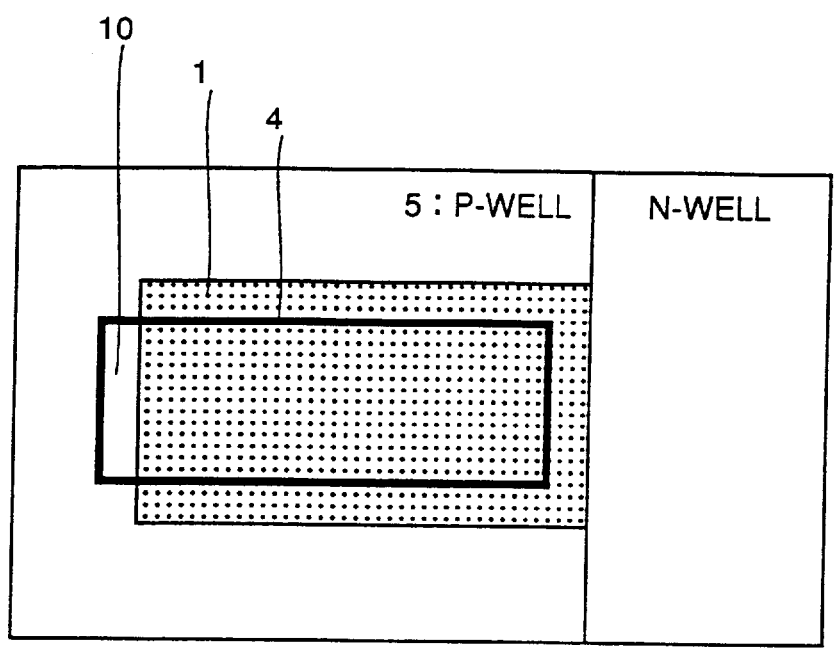
FIG. 2 is a plan view of an MOS capacitance portion in the semiconductor device in accordance with the first embodiment.

FIG. 1 is a cross section of a semiconductor device including an MOS capacitance, in accordance with a first embodiment. FIG. 2 is a plan view of an MOS capacitance portion.

Referring to FIGS. 1 and 2, a P-type well 5 (retrograde well) is formed at the main surface of a P-type semiconductor substrate 1. An N-type capacitance dope layer 4 is provided at the surface of P-type well 5. On semiconductor substrate 1, one of upper/lower electrodes (gate electrode) 8 is provided to be in contact with capacitance dope layer 4 with an insulating film interposed. Gate electrode 8 includes a doped polysilicon layer 6 and a WSi layer 7. At the main surface of P-type well 5, an $N^+$ diffusion layer 10 which is a high concentration impurity diffusion layer of the second conductivity type having higher concentration than capacitance dope layer 4 is provided to electrically connect to capacitance dope layer 4. Capacitance dope layer 4 surrounds $N^+$ diffusion layer 10. On semiconductor substrate 1, the other of upper/lower electrodes 12 is provided to be in contact with $N^+$ diffusion layer 10. P-well 5 is removed right under capacitance dope layer 4.

According to the first embodiment, impurity concentration of P-type semiconductor substrate 1 is about one-hundredth of that of P-type well 5. Therefore, lower parasitic capacitance is caused between capacitance dope layer 4 and P-type semiconductor substrate 1. Meanwhile, $N^+$ diffusion layer 10 is formed within P-type well 5 as before, so that junction leak current of approximately the conventional level (several pAs) can be maintained.

Next, a method of manufacturing the semiconductor device shown in FIG. 1 will be described with reference to its features.

Figure 3A:
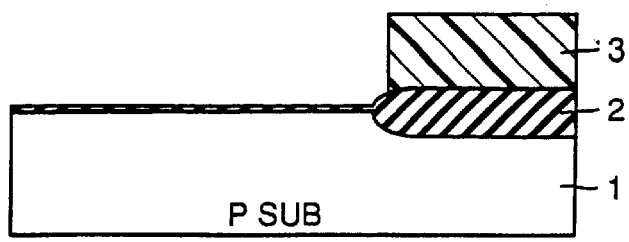
FIGS. 3A to 3D are cross sections showing features of the method of manufacturing the semiconductor device shown in FIG. 1.

Referring to FIG. 3A, a P-type semiconductor substrate 1 is prepared, having an insulating oxide film 2 formed thereat.

Figure 3B:
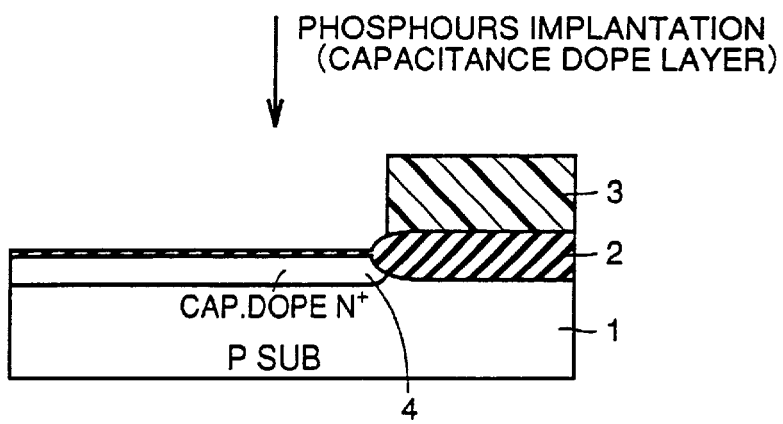

Referring to FIGS. 3A and 3B, a capacitance dope layer 4 is formed by implanting N-type impurity ions into the main surface of semiconductor substrate 1 while using a resist film 3 as a mask. Then, resist film 3 is removed.

Figure 3C:
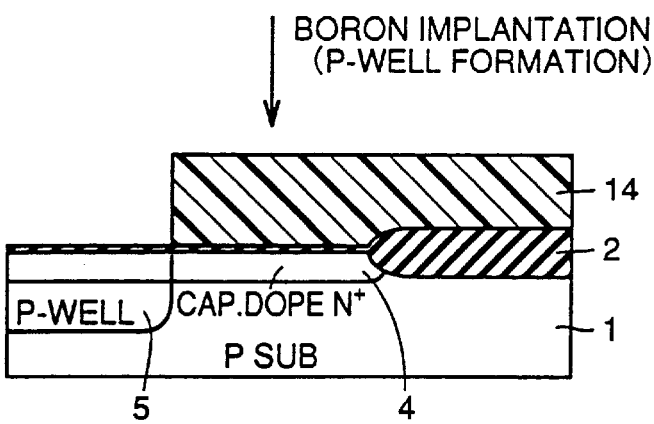

Referring to FIG. 3C, a P-type well 5 is formed at the main surface of semiconductor substrate 1 by implanting P-type impurity ions into the surface while masking the region on capacitance dope layer 4 where one of upper/lower electrodes (gate electrode) is being formed. Resist film 14 is removed.

Figure 3D:
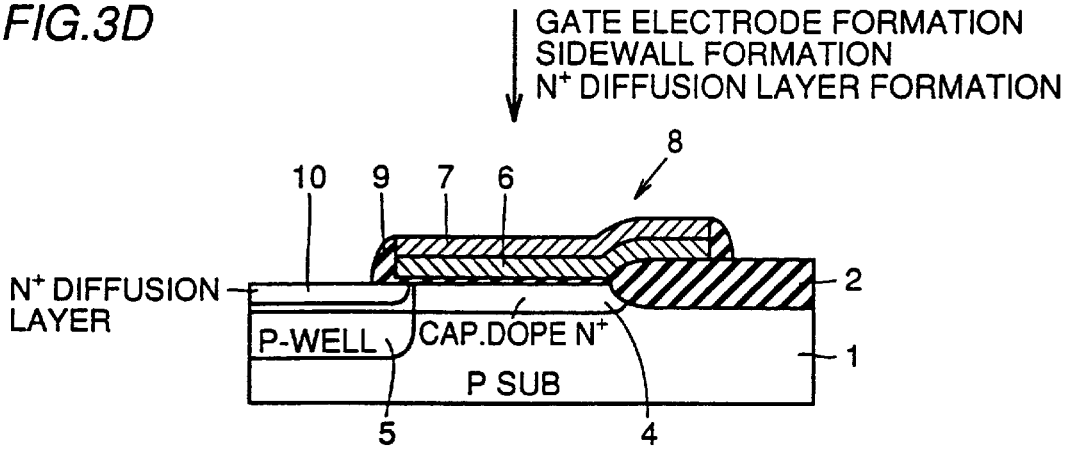
Figure 4A:
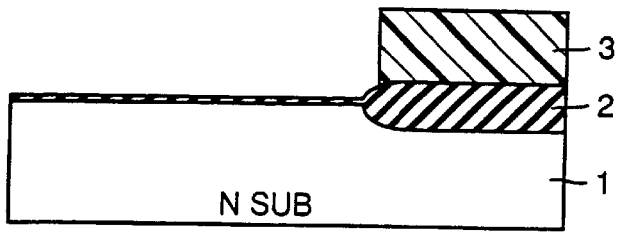
FIGS. 4A to 6D are cross sections showing features of the method of manufacturing semiconductor devices in accordance with second to fourth embodiments, respectively.
Figure 4B:
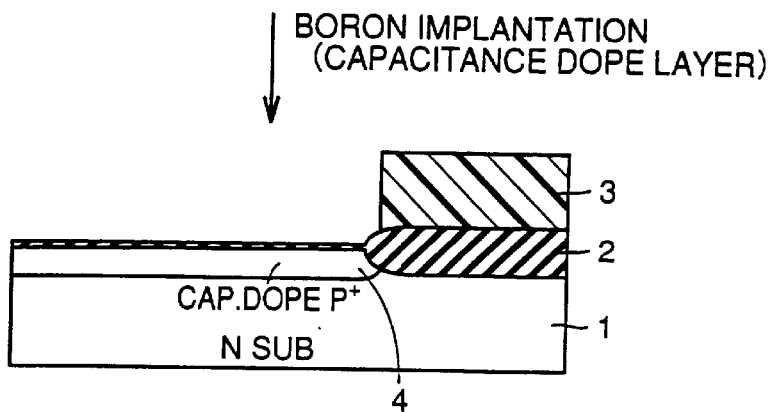
Figure 4C:
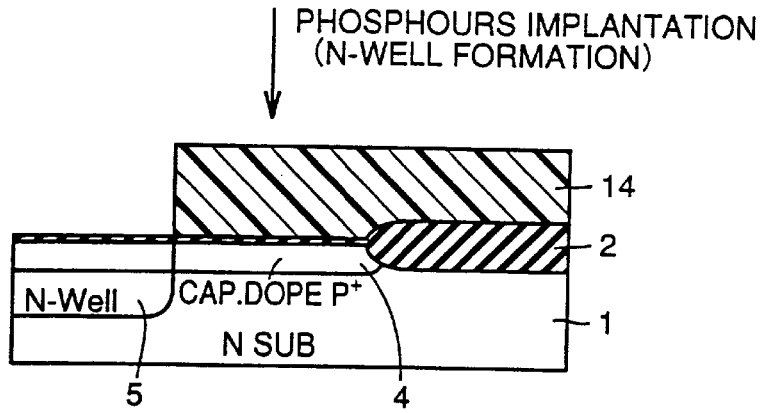
Figure 4D:
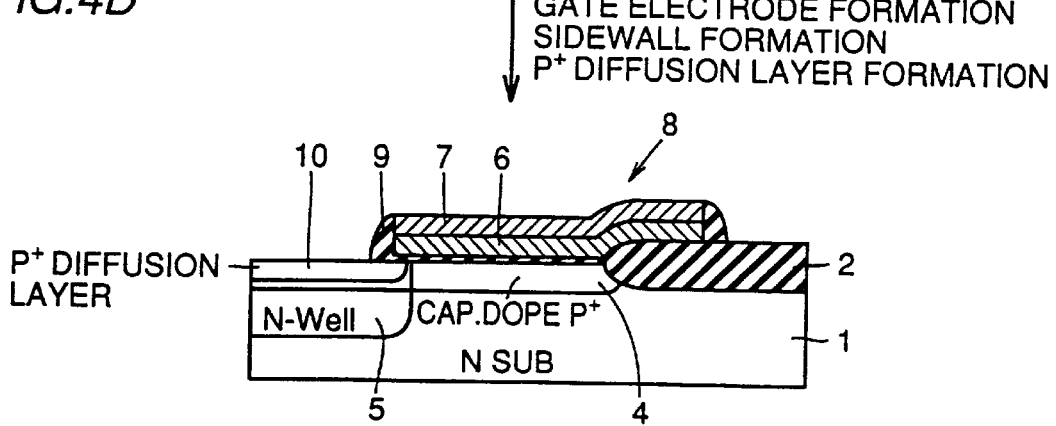
Figure 5A:
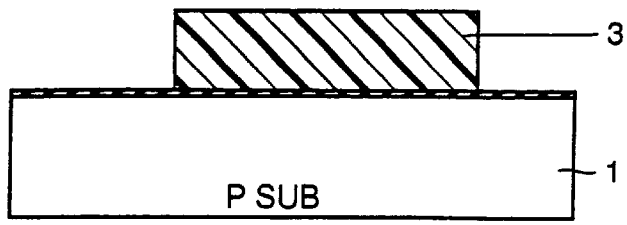
Figure 5B:
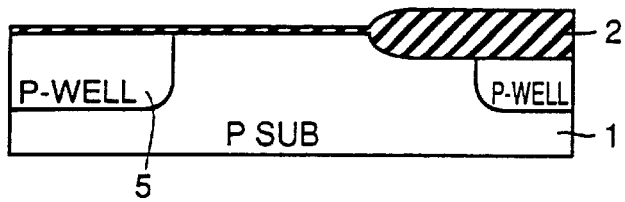
Figure 5C:
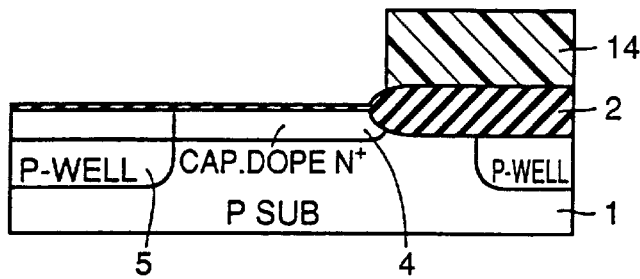
Figure 5D:
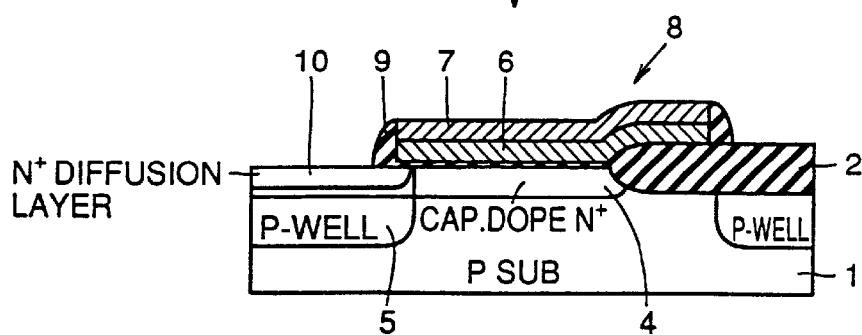
Figure 6A:
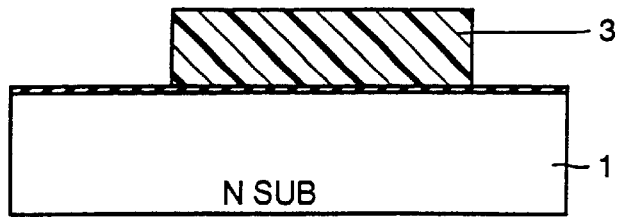
Figure 6B:
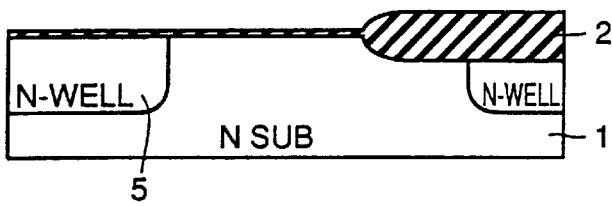
Figure 6C:
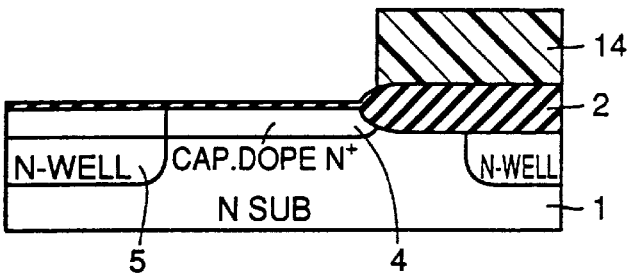
Figure 6D:
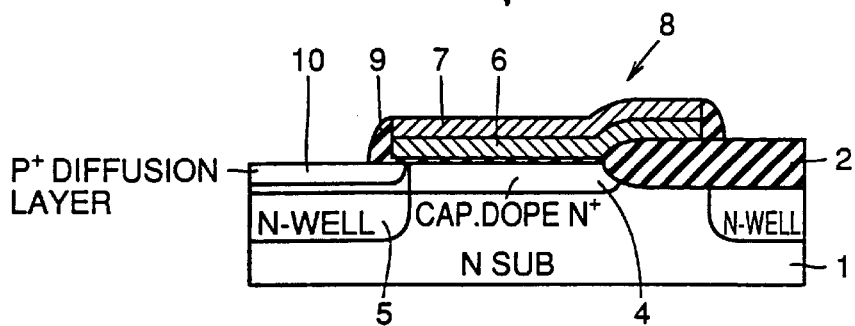

Referring to FIG. 3D, a gate electrode 8 which is one of upper/lower electrodes for the MOS capacitance is formed on capacitance dope layer 4, with an insulating film therebetween. Gate electrode 8 includes a doped polysilicon layer 6 and a WSi layer 7 formed thereon. A sidewall spacer 9 is formed on the sidewall of gate electrode 8. An N-type high concentration impurity diffusion layer ($N^+$ diffusion layer) 10 having higher concentration than capacitance dope layer 4 and electrically connected to capacitance dope layer 4 is formed by implanting $N^+$ impurity ions into the surface of the semiconductor substrate while using gate electrode 8 and sidewall spacer 9 as a mask. The other one of upper/lower electrodes for the MOS capacitance is formed, which electrically connects to $N^+$ diffusion layer 10, resulting in the MOS capacitance shown in FIG. 1.

Second Embodiment

FIGS. 4A to 4D show method of manufacturing a semiconductor device in accordance with a second embodiment. Since the method is the same as that of the first embodiment except that the opposite conductivity type is used, the same or corresponding parts have the same reference numerals and their descriptions will not be repeated. Even with the opposite conductivity type, the second embodiment obtains the same effect as the first embodiment.

Third Embodiment

FIGS. 5A to 5D show method of manufacturing a semiconductor device in accordance with a third embodiment.

Since the third embodiment is the same as the first embodiment except that it uses the heat diffusion process to form a P-well, the same or corresponding parts have the same reference numerals and their descriptions will not be repeated. Although the first embodiment adapts implantation of impurity ions with high energy to form the P-well (by which retrograde well is formed), the same effect can be obtained even if the P-well is formed by the heat diffusion process as in the embodiment.

Fourth Embodiment

FIGS. 6A to 6D show method of manufacturing a semiconductor device in accordance with a fourth embodiment.

Since the embodiment is the same as the second embodiment except that a P-well is formed by the heat diffusion process, the same or corresponding parts have the same reference numerals and their descriptions will not be repeated. This embodiment attains the same result as the second embodiment, even if the P-well is formed by the heat diffusion process.

Fifth Embodiment

Figure 7:
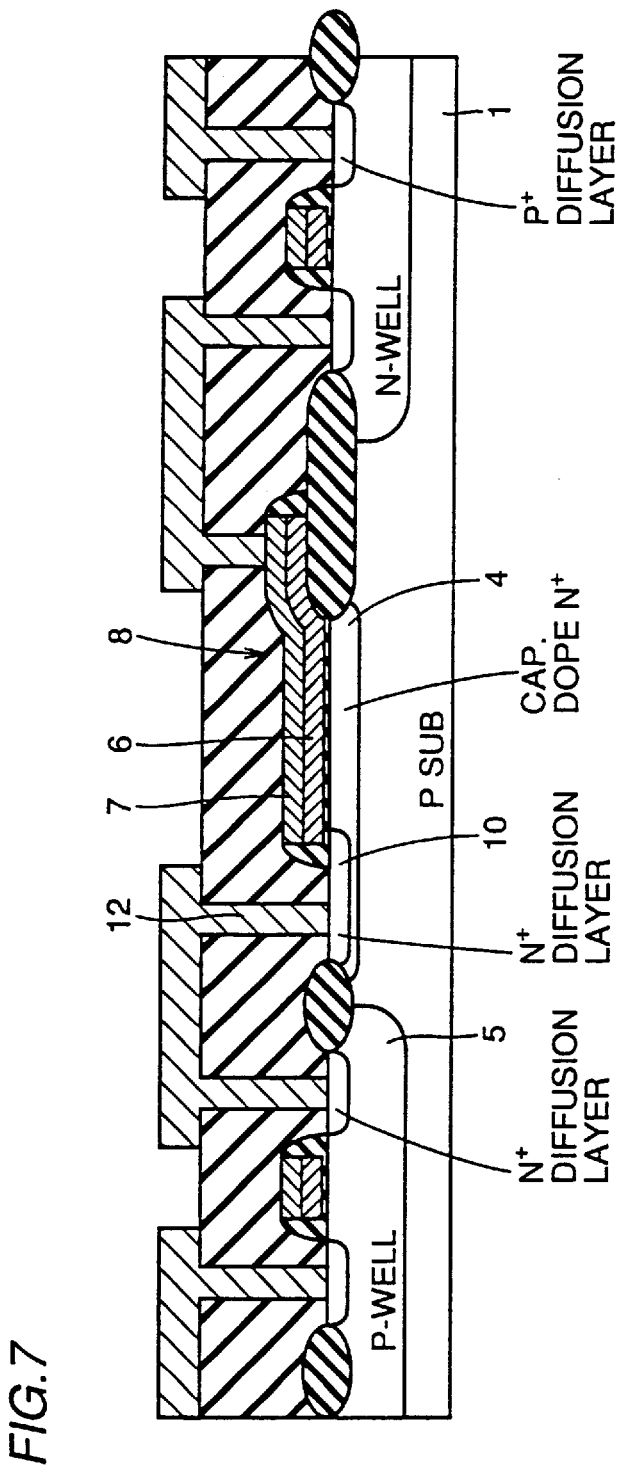
FIG. 7 is a cross section of a semiconductor device in accordance with a fifth embodiment.
Figure 8:
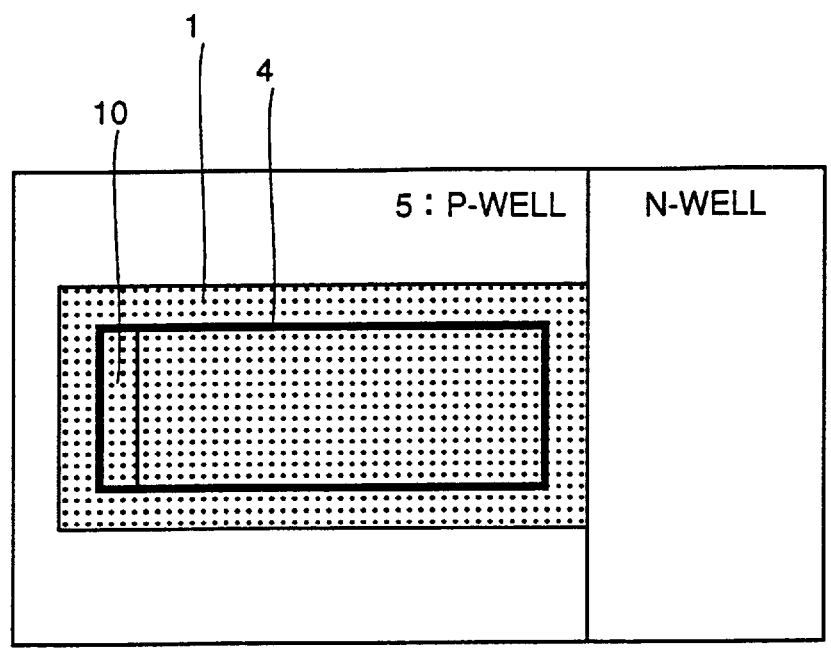
FIG. 8 is a plan view of an MOS capacitance portion in the semiconductor device in accordance with the fifth embodiment.

FIG. 7 is a cross section of a semiconductor device including an MOS capacitance in accordance with a fifth embodiment. FIG. 8 is a plan view of the MOS capacitance portion.

Since the semiconductor device shown in FIGS. 7 and 8 is the same as the one shown in FIGS. 1 and 2 except the following points, the same or corresponding parts have the same reference numerals and their descriptions will not be repeated.

The semiconductor device shown in FIGS. 7 and 8 is different from the one shown in FIGS. 1 and 2 in that a P-type well 5 is removed not only immediately under a capacitance dope layer 4 but immediately under an N$^+$ diffusion layer 10. This N$^+$ diffusion layer 10 is 0.03 $\mu$m and capacitance dope layer 4 is 0.09 $\mu$m in depth. Impurity concentration is $4 \times 10^{15}$/cm$^3$ in N$^+$ diffusion layer 10 and $4 \times 10^{14}$/cm$^3$ in capacitance dope layer 4. According to the embodiment, P-type well 5 is removed not only from capacitance dope layer 4 but from N$^+$ diffusion layer 10, thus significantly lowering parasitic capacitance. According to the embodiment, although a P-well does not exist immediately under N$^+$ diffusion layer 10, capacitance dope layer 4 has larger depth and lower concentration than high concentration impurity diffusion layer 10, thus decreasing its concentration gradient. This suppresses junction leak current.

Features of method of manufacturing the semiconductor device shown in FIG. 7 will be described below.

Figure 9A:
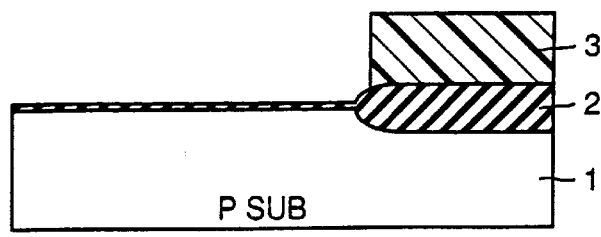
FIGS. 9A to 9C are cross sections showing features of the method of manufacturing the semiconductor device shown in FIG. 7.

Referring of FIG. 9A, a resist film 3 masks a region where a capacitance dope layer is not desired to be formed.

Figure 9B:
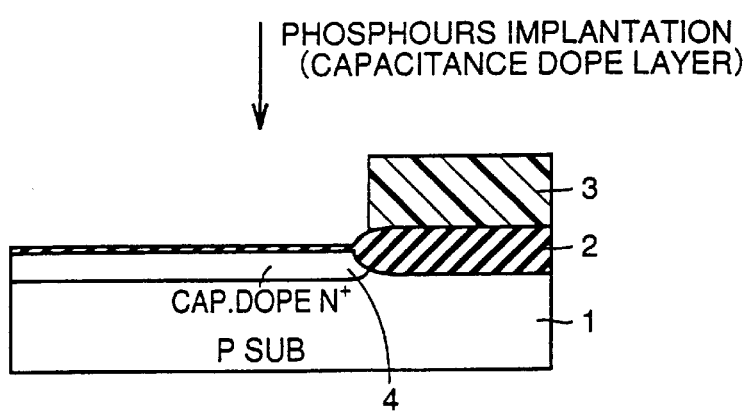

Referring to FIGS. 9A and 9B, a capacitance dope layer 4 is formed by implanting impurity ions into the main surface of the semiconductor substrate while using resist film 3 as a mask.

Figure 9C:
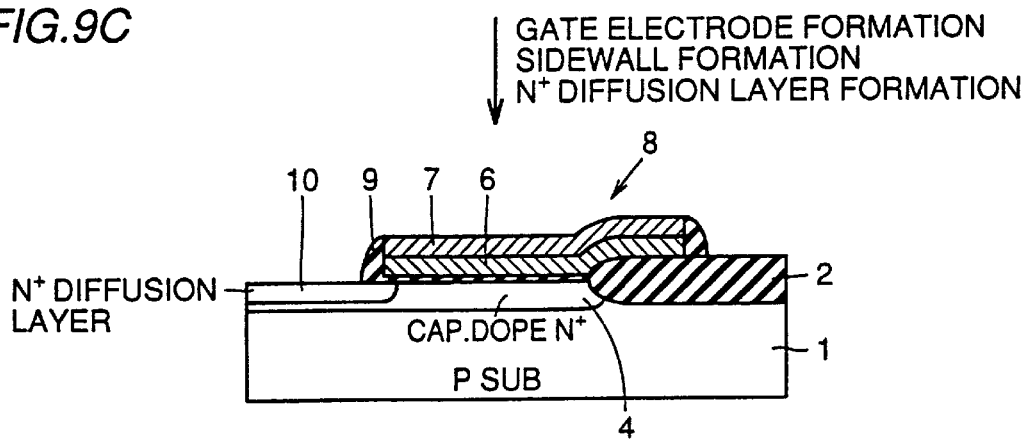
Figure 10A:
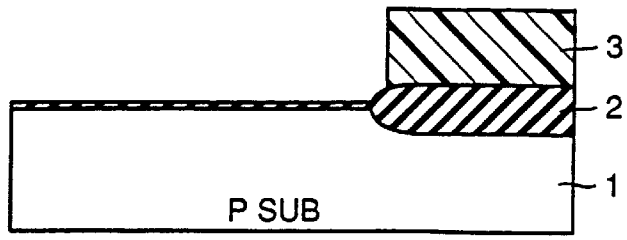
FIGS. 10A to 10D are cross sections showing features of the method of manufacturing a conventional semiconductor device including an MOS capacitance.
Figure 10B:
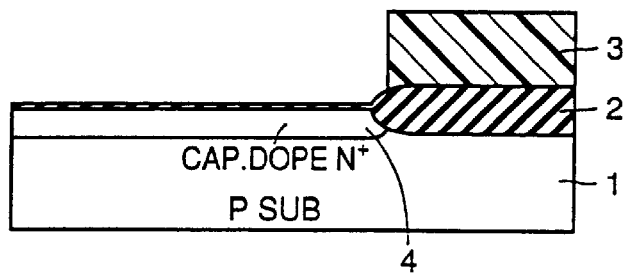
Figure 10C:
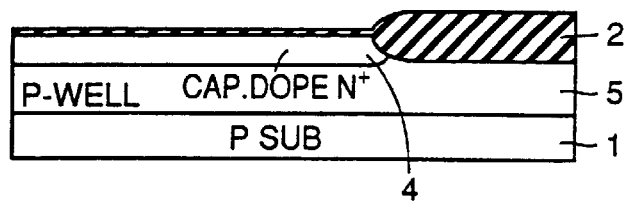
Figure 10D:
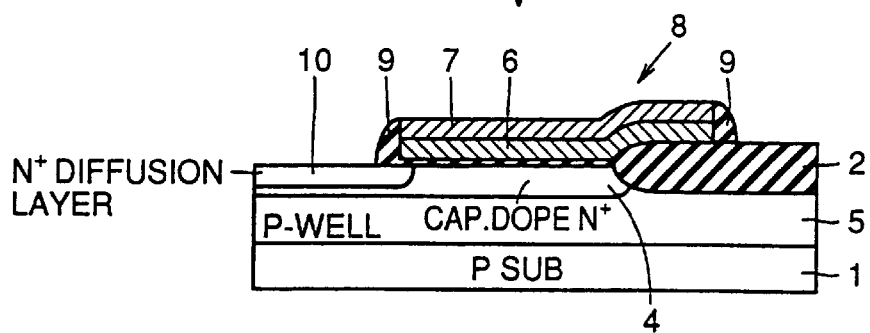
Figure 11:
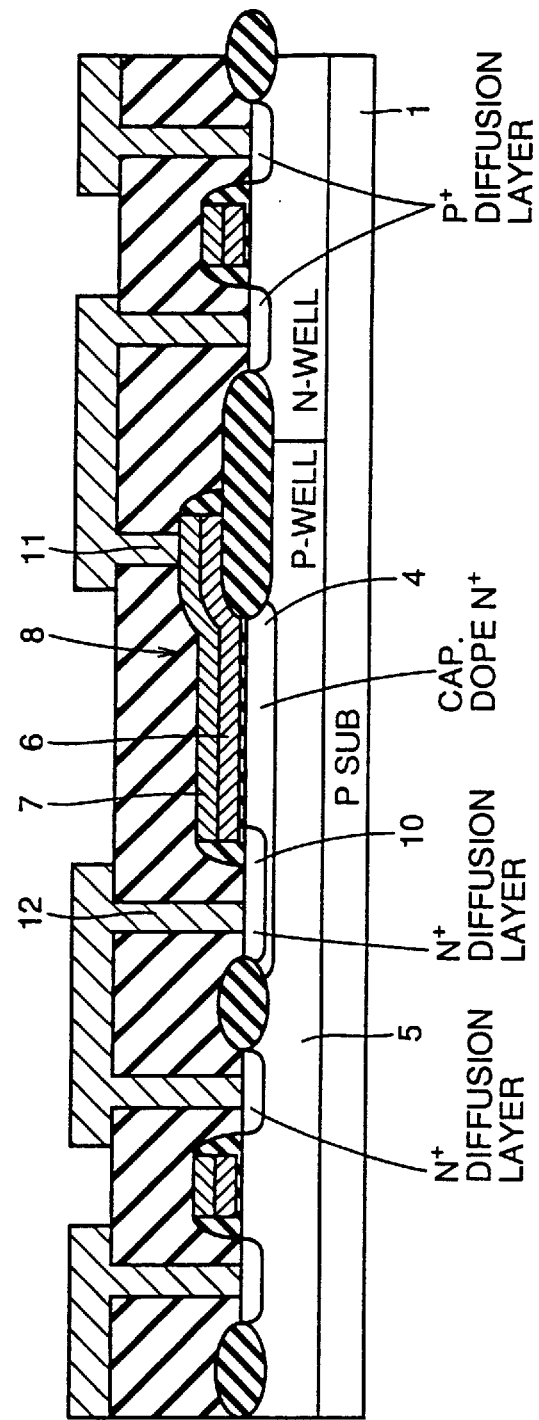
FIG. 11 is a cross section of the conventional semiconductor device including an MOS capacitance.
Figure 12:
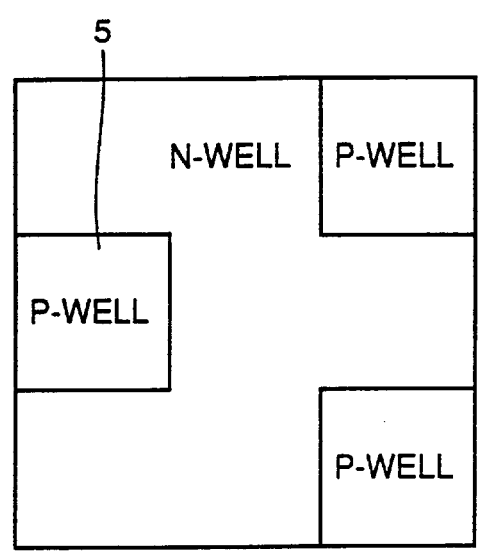
FIG. 12 shows an arrangement of P- and N-wells in a semiconductor substrate.

Referring to FIG. 9C, a gate electrode 8 including a doped polysilicon layer 6 and a WSi layer 7 is formed on capacitance dope layer 4, with an insulating layer therebetween. A sidewall spacer 9 is formed on the sidewall of gate electrode 8. An N$^+$ diffusion layer 10 is formed by implanting impurity ions into the surface of the semiconductor substrate while using gate electrode 8 and sidewall spacer 9 as a mask. Referring to FIG. 8, a P-well is formed by forming a P-type impurity on the semiconductor substrate while masking capacitance dope layer 4 and high concentration impurity diffusion layer 10.

According to the semiconductor device including an MOS capacitance in accordance with the first aspect of the present invention, a well is removed immediately under a capacitance dope layer, thus lowering parasitic capacitance. As a result, the MOS capacitance comes to have improved accuracy.

According to a method of manufacturing the semiconductor device including an MOS capacitance in accordance with the second aspect of the present invention, a well of a first conductivity type is formed at the surface of the semiconductor substrate by implanting impurity ions of the first conductivity type into the substrate while masking the region on the capacitance dope layer where one electrode for the MOS capacitance is to be formed, so that a semiconductor device is obtained which has its well removed immediately under the capacitance dope layer. As a result, the semiconductor device having lowered parasitic capacitance and improved MOS capacitance accuracy is obtained.

According to a method of manufacturing the semiconductor device in accordance with the third aspect of the present invention, a well of a first conductivity type is formed by implanting impurity ions of the first conductivity type into the main surface of the semiconductor substrate while masking a capacitance dope layer and a high concentration impurity layer. Therefore, a well is removed immediately under the capacitance dope layer and the high concentration impurity diffusion layer of the semiconductor device. As a result, a semiconductor device is obtained which has lowered parasitic capacitance and improved MOS capacitance accuracy.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device including an MOS capacitance, comprising:

a semiconductor substrate of a first conductivity type, having a main surface;

a well of the first conductivity type, formed at the main surface of said semiconductor substrate;

a capacitance dope layer of a second conductivity type, provided at a surface of said well of the first conductivity type;

a first electrode provided on said semiconductor substrate on said capacitance dope layer with an insulating film interposed;

a high concentration impurity diffusion layer of the second conductivity type provided at the main surface electrically connected to said capacitance dope layer, said high concentration impurity diffusion layer having higher concentration than said capacitance dope layer; and a second electrode formed on said semiconductor substrate in contact with said high concentration impurity diffusion layer; wherein said well does not extend under the entire capacitance dope layer, and the first conductivity type impurity concentration in the semiconductor substrate is less than that in the well, and said well does not extend under said high concentration impurity diffusion layer.

2. A semiconductor device including an MOS capacitance, comprising:

a semiconductor substrate of a first conductivity type, having a main surface;

a well of the first conductivity type, formed at the main surface of said semiconductor substrate;

a capacitance dope layer of a second conductivity type, provided at a surface of said well of the first conductivity type;

a first electrode provided on said semiconductor substrate on said capacitance dope layer with an insulating film interposed;

a high concentration impurity diffusion layer of the second conductivity type provided at the main surface electrically connected to said capacitance dope layer, said high concentration impurity diffusion layer having higher concentration than said capacitance dope layer; and a second electrode formed on said semiconductor substrate in contact with said high concentration impurity diffusion layer; wherein said well does not extend under the entire capacitance dope layer, and the first conductivity type impurity concentration in the semiconductor substrate is less than that in the well, and said capacitance dope layer surrounds said high concentration impurity diffusion layer.

* * * * *